United States Patent [19]

Rogers et al.

[11] Patent Number: 5,951,881
[45] Date of Patent: Sep. 14, 1999

[54] FABRICATION OF SMALL-SCALE CYLINDRICAL ARTICLES

[75] Inventors: John A. Rogers; Rebecca J. Jackman, both of Cambridge; George M. Whitesides, Newton, all of Mass.

[73] Assignee: President and Fellows of Harvard College, Cambridge, Mass.

[21] Appl. No.: 08/681,235

[22] Filed: Jul. 22, 1996

[51] Int. Cl.$^6$ .................................................. H01L 22/027
[52] U.S. Cl. .................................................. 216/41; 216/8
[58] Field of Search ........................................ 216/8, 41

[56] References Cited

U.S. PATENT DOCUMENTS

| | | | |
|---|---|---|---|
| 4,528,260 | 7/1985 | Kane | 430/321 |
| 4,728,591 | 3/1988 | Clark et al. | 430/5 |
| 4,735,890 | 4/1988 | Nakane | 430/311 |
| 4,802,951 | 2/1989 | Clark et al. | 156/630 |
| 4,810,621 | 3/1989 | Akkapeddi et al. | 430/321 |
| 4,897,325 | 1/1990 | Akkapeddi et al. | 430/5 |
| 4,950,568 | 8/1990 | Kraus | 430/5 |
| 5,017,960 | 5/1991 | Tuulse | 355/91 |
| 5,018,829 | 5/1991 | Ogawa | 350/96.34 |
| 5,079,600 | 1/1992 | Schnur et al. . | |
| 5,112,438 | 5/1992 | Bowers | 156/655 |
| 5,153,084 | 10/1992 | Foust et al. | 430/5 |
| 5,178,976 | 1/1993 | Rose et al. | 430/5 |
| 5,421,955 | 6/1995 | Lau et al. | 216/48 |
| 5,512,131 | 4/1996 | Kumar et al. | 156/630.1 |

FOREIGN PATENT DOCUMENTS

| | | |
|---|---|---|
| 0140259 A2 | 5/1985 | European Pat. Off. . |
| 0 441 693 A1 | 8/1991 | European Pat. Off. . |
| 04073917 | 3/1992 | Japan . |
| WO 97/07429 | 2/1997 | WIPO . |

OTHER PUBLICATIONS

R. Kashyap et al., "UV written reflection grating structures in photosensitive optical fibres using phase–shifted phase marks", *Electronics Letters*, vol. 30, No, 23, pp. 1977–1978, Nov. 10, 1994.

HIll, K.O. et al., "Birefringent Photosensitivity in Monomode Optical Fibre; Application to External Writing of Rocking Filters", *Electronics Letters*, vol. 27, No. 17, pp. 1548–1550, Aug. 15, 1991.

"Plated Metal Mask for Precise Excimer Laser Ablation of Glasses", *IBM Technical Disclosure Bulletin*, vol. 34, No. 6, p. 253, Nov. 1991.

Ashish M. Vengsarkar, Paul J. Lemaire, Justin B. Judkins, Vikram Bhatia, Turan Erdogan and John E. Sipe, "Long--Period Fiber Gratings as Band–Rejection Filters", Journal of Lightwave Technology, vol. 14, No. 1, Jan. 1996, pp. 58–65.

Dean L. Olson, Timothy L. Peck, Andrew G. Webb, Richard L. Magin and Jonathan V. Sweedler, "High–Resolution Microcoil $^1$H–NMR for Mass–Limited, Nanoliter–Volume Samples", Science, vol. 270, Dec. 22, 1995, pp. 1967–1970.

K.O. Hill, B. Malo, F. Bilodeau and D.C. Johnson, "Photosensitivy in Optical Fibers", Annu. Rev. Mater. Sci. 1993, 23:pp. 125–157.

S. Kawahito, Y. Sasaki, H. Sato, T. Nakamura and Y. Tadokoro, "A Fluxgate Magnetic Sensor with Micro–Solenoids and Electroplated Permalloy Cores", Sensors and Actuators A, 43 (1994) pp. 128–134.

"Microfabrication Techniques in Optical Integrated Circuits", Optical Integrated Circuits, pp. 172–223.

"Guide–Wave Control", Optical Integrated Circuits, pp. 96–137.

William W. MOrey, Gary A. Ball and Gerald Meltz, "Photoinduced Bragg Gratings in Optical Fibers", Optics & Photonics News, Feb. 1994, pp. 8–14.

Ron Dagani, "Smaller Samples, More Sensitivity for NMR", C&EN, News of the Week, Jan. 1, 1996, pp. 8–9.

T.P. Moffat et al., "Patterned Metal Electrodeposition Using an Alkanethiolate Mask", J. Electrochem. Soc., vol. 142, No. 11, Nov. 1995.

J.K. Schoer et al., "Scanning Probe Lithography", Langmuir, vol. 10, No. 3, pp. 615–618, 1994. (Abstract Only).

E.A. Dobisz et al., "Self–Assembled Monolayer Films for Nanofabrication", Mat. Res. Soc. Symp. Proc., vol. 380, 1995.

Enoch, Kim et al. "Combining Patterned Self–Assembled Monolayers of Alkanethiolates on Gold with Anisotropic Etching of Silicon to Generate Controlled Surface Morphologies". J. Electrochem. Soc. vol. 142. No. 2. pp. 628–633 (Feb. 7, 1995).

Jacobsen et al. "Fabrication of Micro–Structures Using Non–Planar Lithography (NPL)" Proceedings. IEEE Micro Electro Mechanical Systems. An Investigation of Micro Structures. Sensors. Actuators. Machines and Robots. Nara. Japan. Jan. 30–Feb. 2, 1991.

*Primary Examiner*—Maria Nuzzolillo
*Assistant Examiner*—Laura Weiner
*Attorney, Agent, or Firm*—Wolf, Greenfield & Sacks. P.C.

[57] ABSTRACT

Techniques for fabrication of small-scale metallic structures such as microinductors, microtransformers and stents are described. A chemically active agent such as a catalyst is applied from an applicator in a pattern to an exterior surface of an article, metal is deposited according to the pattern and optionally, removed from the substrate. Where the substrate is cylindrical, the pattern can serve as a stent. Alternatively, a pattern of a self-assembled monolayer can be printed on a surface, which pattern can dictate metal plating or etching resulting in a patterned metal structure that can be cylindrical. In another embodiment, a structure is patterned on a surface that serves as a phase-modulating pattern or amplitude-modulating pattern. The article subsequently is exposed to radiation that can induce a change in refractive index within the article, and the phase-modulating or amplitude-modulating pattern results in different indices of refraction being created in different portions of the article. By this technique, a grating can be written into a core of an optical fiber.

28 Claims, 7 Drawing Sheets

FABRICATION OF SMALL-SCALE CYLINDRICAL ARTICLES

RELATED APPLICATION

This application claims priority to U.S. provisional patent application Ser. No. 60/019,065 of Rogers, et al., filed May 9, 1996 and entitled "Microcontact Printing of Photomasks on Optical Fibers for Generation of In-Fiber Gratings", incorporated herein by reference.

This invention was supported by NSF Grant Numbers PHY9312572 and DMR9400396, and ONR Contract Numbers N00014-93-I-0498 and N00014-95-I-1182, and the government has certain rights to the invention.

FIELD OF THE INVENTION

The invention relates generally to the fabrication of small-scale patterned cylindrical structures and more particularly to techniques for optically writing diffraction gratings in optical fibers with the use of a photomask printed on an optical fiber, and the fabrication of coils and cylindrical grid structures on cylindrical substrates for use as microtransformers, microelectromagnets, and intra-vascular stents.

BACKGROUND OF THE INVENTION

Optical fibers are constructed of a cylindrical core of a first material, typically ceramic such as silica, or glass, surrounded by a cladding of a second material that can be similar to that of the core. A protective jacket can be provided about the cladding, formed typically of a polymer. The core material of an optical fiber has a higher index of refraction than its cladding, therefore optical signals can be made to propagate along the core and are totally internally reflected.

In 1978 it was discovered that, in optical fibers in which the core material could be made to undergo a change in refractive index upon exposure to light of a particular wavelength at a threshold intensity, diffraction gratings could be written by optically writing into the fibers alternating regions of relatively higher and relatively lower refractive indices (see, for example, Hill, et al. *Appl. Phys. Lett.* 32: 647–49, 1978). Since their discovery, in-fiber gratings have found application as temperature and strain sensors, fiber optic mirrors, filters, mode converters, wavelength demultiplexers, etc. These and other applications define, in part, a need for the development of reliable and economic method for fabricating in-fiber gratings.

An "internal writing technique" for optically writing a diffraction grating in an optical fiber involves introducing light into an end of an optical fiber and allowing an interference pattern to be established with counter-propagating light (Fresnel-reflected from the far end of the fiber) to form a standing wave in the fiber. In a fiber in which the core is photosensitive (able to undergo a change in refractive index upon exposure to radiation), the refractive index of the fiber core is altered disproportionately greatly at points of constructive interference, thus a refractive index perturbation (index grating) is formed that has the same spatial periodicity as the interference pattern. Such a refractive index grating acts as a distributed (Bragg) reflector (see Hill et al., "Photosensitivity in Optical Fibers", *Annual Review of Materials Science*, 23 125 (1993); Vengsarkar, et al., "Long-period Fiber Gratings as Band-Rejection Filters", *Journal of Lightwave Technology*, 14:1 (January, 1996).

A later-developed "external writing technique" for creating in-fiber optic gratings involves irradiating an optical fiber with two separately-oriented laser beams originating from a single beam which is split and then made to intersect at the optical fiber core. The intersecting beams form an interference pattern within the core of the fiber and, if the fiber core is photosensitive, regions at which the beams constructively interfere undergo a disproportionately high change in refractive index, thus an index grating is written in the fiber core (See Meltz, et al. "Formation of Bragg Gratings in Optical Fibers by a Transverse Holographic Method", Optics Letters, 14, 823 (1989)). With the external writing technique, an additional degree of freedom for writing refractive index gratings exists since the period of the interference pattern depends not only on the wavelength of light used for writing (the only adjustable parameter in the internal writing technique) but the angle between the two interfering laser beams affects the period of the interference pattern within the optical fiber core. With external writing, gratings can be written in standard telecommunications fibers to be Bragg-resonant at wavelengths of interest for fiber optic communications. (See Kashyap et al., *Electron. Lett.*, 26 730–32 (1990)).

Another technique for external writing of gratings in optical fibers is a "point-by-point" technique. This involves translation of an optical fiber, by precision motors, past an aperture through which light from a light source passes and strikes the fiber. A portion of the fiber is positioned adjacent the aperture and exposed to the light source, exposure is discontinued, the fiber is moved to expose a different portion to the aperture, and the process repeated until a particular set of regions of the optical core have been exposed to light inducing a change in refractive index of those regions. (See Hill, et al. *Electron. Lett.* 26, 1270–72 (1990); and Malo, et al., "Point-by-Point Fabrication of Micro-Bragg Gratings in Photosensitive Fibre Using Single Excimer Pulse Refractive Index Modification Techniques" *Electron. Lett.*, 29 1668–69 (1993)).

Another external writing technique involves passing light through a grating phase mask or amplitude mask placed near or adjacent an optical fiber having a photosensitive core and illuminating the fiber core through the phase mask. A diffraction pattern is thereby generated and applied to the fiber core, thus writing a grating in the core as described above (See Hill, et al., "Bragg Gratings Fabricated in Monomode Photosensitive Optical Fibers by UV Exposure Through a Phase Mask", *Applied Physics Letters*, 62, 1035 (1993)).

Askins, et al., "Fiber Bragg Reflectors Prepared by a Single Excimer Pulse", *Opt. Lett.*, 17, 833, 835 (1992), and Dong et al., "Single Pulse Bragg Gratings Written During Fibre Drawing", *Electron Lett.*, 29 1577–1578 (1993) describe exposure of a photosensitive optical fiber to a single 20 nanosecond excimer laser pulse to write a grating in the fiber core. This technique is known as the "single shot" method, and requires a very powerful radiation source.

While the above-described techniques find use in some circumstances, the internal writing technique does not allow freedom in variation of the period of the interference pattern created sufficient to produce gratings for several applications nor, typically, can it be written without a DC component from the source undesirably affecting the grating. As for the external writing techniques, the interference, phase mask, and point-by-point techniques often are complicated by instability between the light source, optical fiber and mask or aperture. If all components are not completely stable with respect to one another, inaccuracy and imprecision in the resultant grating can occur. Additionally, the interference, single-shot and point-by-point techniques involve relatively complicated and expensive apparatus.

Additionally, techniques such as the internal writing, external writing interference, and external phase mask techniques typically result in a pattern that is a sinusoidal variation in index of refraction, rather than a square wave index pattern or patterns with more complex geometries.

Another field that involves fabrication in connection with small-scale articles such as cylindrical articles is the field of microelectronics. Miniaturization of electrical components has created a need for microinductors and microtransformers. The large number of turns per unit length required for these structures makes fabrication of miniaturized inductors and transformers challenging. While several different methods for the generation of planar microtransformers using conventional silicon processing techniques have been developed, conventional techniques such as photolithographic processes can form high resolution patterns on planar substrates but lack the depth of focus to pattern non-planar substrates. Three-dimensional structures typically are obtainable only through stepwise addition or removal of planes or strips of material, a labor and material-intensive process, that limits the possible geometries.

Kawahito, et al., in an article entitled "A Fluxgate Magnetic Sensor With Micro-Solenoids And Electroplated Permalloy Cores", *Sensors and Actuators A,* 43, 128–134 (1994), describe a fluxgate magnetic sensor produced via silicon micro-technology. For a rod-core sensor, a relatively complicated fabrication process is involved including groove formation, round etching and oxidation, electron-beam lithography, evaporation and liftoff, $SiO_2$ sputtering and Cu electron-beam evaporation, Cu patterning and resist patterning, NiFe selective electroplating, Cu film removal and planarization, and through-hole and Al patterning.

In an article entitled "High-Resolution Microcoil $^1$H-NMR For Mass-Limited Nanoliter-Volume Samples", *Science,* 270, 1967–1970 (Dec. 22, 1995), Olson, et al., described a polyimide-coated fused-silica capillary surrounded by a microcoil for use in proton micro-NMR spectroscopy. The microcoil was made from 50 micron diameter wire, and was wound about the cylindrical substrate. Adhesive was applied to adhere the coil to the substrate. Coil fabrication was monitored with a dissecting stereomicroscope.

While fabrication of three-dimensional microelectronic devices has yielded some successes, known techniques for such fabrication are relatively complicated.

Stents are tiny scaffolds that can be introduced into a blood vessel, typically a coronary artery after balloon angioplasty, and expanded in the vessel to hold the vessel open. Because stents are cylindrical structures of metal with feature sizes in the range of 50–100 microns, they can be difficult to produce using conventional methods and, as a result, costs are high. U.S. Pat. No. 4,655,771 (Wallsten) describes a stent for transluminal implantation. The device can be fabricated by weaving, and points at which filaments defining the stent cross can be welded together.

Accordingly, it is an object of the present invention to provide a simple, relatively inexpensive technique for optically writing refractive index patterns in photosensitive articles that is adaptable for a wide variety of end products, that utilizes simple, readily-available materials, and that eliminates instability problems.

It is another object of the invention to provide a simple, relatively inexpensive technique for fabricating small-scale, three-dimensional, preferably cylindrical metal structures such as microtransformers, microinductors, and stents.

SUMMARY OF THE INVENTION

The present invention provides techniques for imparting different indices of refraction in an article. The article can be any material that is susceptible to change in index of refraction via irradiation, and can take the form of an optical fiber, a waveguide, or the like. One technique involves directing converging radiation at first and second radiation-sensitive portions of an article under conditions in which radiation-sensitive portions can undergo a change in refractive index. The first portion of the article is allowed to undergo a change in refractive index imparted by the converging radiation. The second portion of the article, however, retains a refractive index distinguishable from that of the first portion. The first and second radiation-sensitive portions can be contiguous, and can alternate. That is, portions of the article that undergo a change in refractive index can alternate with contiguous, adjacent portions that do not undergo such a change. One aspect of the technique involves surrounding an optical fiber with radiation that can impart in the fiber core a change in refractive index, causing the radiation to converge on the optical fiber, and allowing alternating portions of the core to be exposed to the radiation and thereby to undergo a change in refractive index. An in-fiber grating results.

One embodiment of the invention involves providing an article as described above and forming, at a surface of the article, a radiation-altering pattern to prepare the article for conversion to one having areas defined by different indices of refraction. Radiation is directed at the article under conditions in which radiation-sensitive portions can undergo a change in refractive index. Not all of the article portions to which radiation is directed undergo significant change in refractive index, however. A first radiation-sensitive portion is allowed to undergo a change in refractive index while a second radiation-sensitive portion retains a refractive index distinguishable from the refractive index of the first portion. According to one aspect, as described above, the first and second radiation-sensitive portions can be contiguous and alternating, as in an optical fiber in which a diffraction grating is written.

The above and other techniques of the invention can be carried out by applying to the surface of the article an amplitude-modulating agent and allowing radiation directed at the second radiation-sensitive portion to be modulated by the amplitude-modulating agent to the extent that the second radiation-sensitive portion retains a refractive index distinguishable from that of the first portion. This can involve transferring a precursor of a photomask to a surface of the article to form, on the surface, a photomask (optionally via chemical or physical change of the precursor) where the photomask is a radiation-blocking agent. The amplitude-modulating agent, or a precursor thereof, such as a photomask precursor can be applied to the surface of the article from an applicator having a contoured surface defining a pattern of protrusions and intervening indentations. The protrusions, or indentations, can carry the agent or precursor, the contoured surface applied to the surface of the article, and the agent or precursor thereby transferred to the article surface. The protrusions and indentations can be sized and spaced according to the desired resultant photomask pattern (and eventual differential refractive index pattern).

The above techniques of the invention also can be carried out by applying to a surface of the article an agent in a phase-modulating pattern. According to this embodiment, the technique involves allowing radiation to be diffracted by the phase-modulating pattern to create a diffraction pattern. The diffraction pattern applies radiation to a first region of the radiation-sensitive portion to an extent greater than to the second region. According to another embodiment, a phase-modulating pattern is created in the surface of the article and the above-described exposure technique is carried out.

The invention also provides articles having radiation-altering patterns printed thereon. According to one embodiment, the invention provides an article having a radiation-sensitive portion and a surface, and a radiation-altering patterns, such as a radiation-blocking agent on the surface that fastens to the surface to the extent that vibrations experienced by the article cause the radiation-altering pattern to translate with the article. When the article is exposed to radiation that can induce a change in refractive index of the radiation sensitive portion, a first region of the radiation-sensitive portion that is blocked by the blocking agent from radiation retains a first refractive index. The first refractive index is distinguishable from a second refractive index imparted to a second region of the radiation-sensitive portion not blocked by the blocking agent. The first and second regions are clearly delineated. According to one embodiment, an article has a radiation-altering pattern formed at its surface that, when radiation is directed at the first and second radiation-sensitive portions (under conditions in which radiation-sensitive portions of the article can undergo a change in refractive index) can alter the radiation so as to induce a change in the refractive index of the first portion while allowing a second portion to retain a refractive index distinguishable from that of the first portion. In all cases, the second portion may retain its original refractive index, or may undergo a change in refractive index, but the article can produce a refractive index in the first portion different from the refractive index in the second portion.

The present invention also provides a number of small-scale devices that can be used as microelectronic and analytical elements. In one aspect the invention provides an article that comprises an electrically-conductive coil having a layer of turns of at least 30 turns per mm. In one embodiment, the coil is disposed on a cylindrical surface of a cylindrical article, such as a tube which can be constructed and arranged to receive a sample for NMR analysis and to be positioned in NMR analysis equipment.

The invention also provides an article having an exterior surface and an interior receptacle and an electrically-conductive material deposited on at least a portion of the exterior surface. The article can be cylindrical, and can be constructed and arranged to receive a sample of NMR analysis and to be positioned in NMR analysis equipment.

According to another embodiment the invention provides a device including a cylindrical portion having a surface and an electrically-conductive material deposited on the surface defining a pattern including at least one continuous, isolated section that encircles the cylindrical portion. In one embodiment, the device includes material, such as ferromagnetic material, positioned axially within the cylindrical portion.

According to another aspect, the invention provides methods for fabrication of small-scale articles. In one embodiment, a method of the invention involves chemically depositing, on an exterior surface of a receptacle, or an electrically-conductive material in a pattern. In another embodiment, the invention provides a method involving forming a pattern of a self-assembled monolayer on an exterior surface of a cylindrical article. In either case the pattern includes at least one continuous, isolated portion that encircles the cylinder. The article can be contacted with an etchant that reacts chemically with the article thereby degrading a portion of the article in a pattern dictated by the pattern of the self-assembled monolayer.

According to another embodiment, the invention provides a method that involves forming a pattern of a molecular species on an exterior surface of a cylindrical article. The molecular species can be a self-assembled monolayer or a catalyst, according to preferred embodiments, and the pattern includes one continuous, isolated portion that encircles the cylinder. The surface of the article then is plated with a plating reagent in a pattern dictated by the molecular species.

The invention also provides a method that involves forming, on an exterior surface of a cylindrical substrate, a discontinuous, interconnected, cylindrical, metallic article. The metallic article then is removed from the substrate. The article can be formed on the substrate by providing a layer of metal on the exterior surface and removing one portion of the layer of metal while allowing a second, discontinuous, interconnected portion of the metal layer to remain on the substrate and to define the metallic article. The first portion can be removed by chemical etching by, for example, protecting the second portion of the metal with an etchant resist made from a resist precursor transferred from an application surface of an applicator. The etchant resist precursor can be a self-assembled monolayer, optionally including an etchant resist deposited thereon after formation of a patterned self-assembled monolayer.

Alternatively, the etchant resist can be a metal, the etchant resist formed by depositing an activating agent capable of promoting deposition of a metal on the second portion of the layer of metal, followed by deposition of metal at the second portion.

According to another embodiment, the method of forming a discontinuous, interconnected, cylindrical metallic article on a substrate and removing the article from the substrate involves providing a metal layer on the substrate, removing a first portion of the metal layer while allowing a second, discontinuous, interconnected portion to remain on the substrate, and depositing a metal that defines the discontinuous, interconnected, metallic article on the second portion of the metal layer. In one embodiment, the second portion of the metal layer is a catalyst, and the depositing step involves carrying out electroless metal deposition at the second portion of the metal layer. In another embodiment, the depositing step involves electrochemically depositing a metal that defines the metallic article on the second portion of the metal layer. The metal layer and the electrochemically-deposited metal can be the same. The first portion of the layer of metal deposited on the substrate can be removed via the above-described techniques.

In one embodiment, the article removed from the substrate is designed for use as a stent.

The invention also provides articles and devices formed according to the above-described methods, and provides methods of use of these and others of the above-described articles.

DETAILED DESCRIPTION OF THE INVENTION

Figure 1:
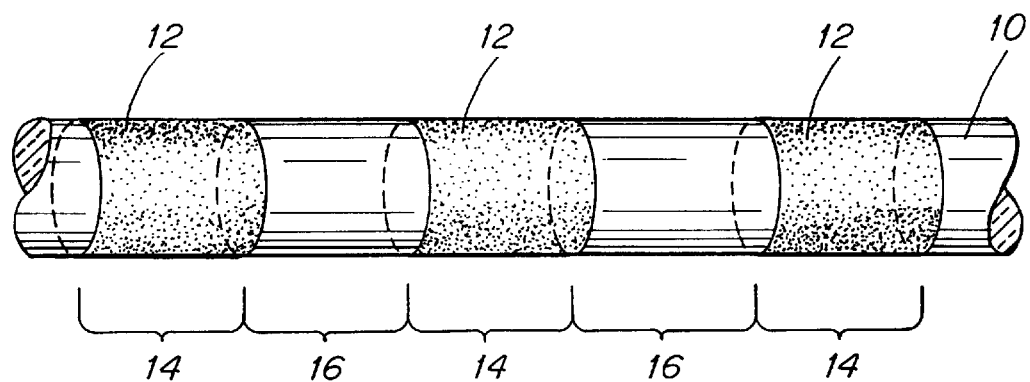
FIG. 1 illustrates schematically an optical fiber coated with a radiation-altering pattern, in particular a photomask, in accordance with the invention.

According to one aspect, the present invention provides relatively simple and cost-effective, yet precise and adaptable, techniques for optically writing differential indices of refraction into radiation-sensitive articles. The invention involves creating radiation-altering patterns such as masking at a surface of an article and exposing the article to radiation selected to induce, in at least a portion of the article, a change in index of refraction. The invention can be applied to a wide variety of articles including, without limitation, optical fibers and waveguides. The radiation-altering pattern can be an amplitude-modulating pattern which shadows radiation-sensitive portions of the article from radiation to an extent distinguishable from un-shadowed or lesser-shadowed portions. The radiation-altering pattern also can be a phase-modulating pattern which alters the phase of radiation thereby creating minima and maxima in intensity of radiation striking radiation-sensitive portions of the article.

As used herein, the term "radiation sensitive" is meant to define a material that, when exposed to a particular form of radiation (for example ultraviolet light) will undergo a change in refractive index in at least a portion of the article. "Radiation selected to induce a change in refractive index" is meant to define a particular form of radiation that is selected in conjunction with the radiation-sensitive material such that a change in refractive index in at least a portion of the material can be effected. That is, the radiation-sensitive material and the radiation selected to induce a change in refractive index can be, and preferably are, selected in conjunction with one another. Materials and radiation sources that meet these criteria are well-known to those of ordinary skill in the art and are readily available. Following is an exemplary, non-limiting list of radiation-sensitive materials and radiation sources suitable for use in connection with the present invention. Materials and sources described in Vengsarkar et al., "Long-Period Fiber Gratings as Band-Rejection Filters", *Journal of Lightwave Technology* 14, 1, 58–65 (January 1996); Morey et al., "Photoinduced Bragg Gratings in Optical Fibers" *Optics & Photonics News,* 8–14 (February 1994); Hill, et al., "Photosensitivity in Optical Fibers" *Annu. Rev. Mater. Sci.* 23, 125–157 (1993); and Hill et al., "Fiber Optics: Advances in Research and Development", pp. 211–240, New York: Plenum (1979), all incorporated herein by reference. Materials such as glass, germanium oxide glass, germanium-doped silica, europium-doped silica, cerium-doped silica, x-ray treated glass, lithium and strontium-barium niobates, barium titanate, polycrystaline materials, photopolymers, and Kerr-effect materials are some that show change in refractive index upon application of radiation, especially UV and visible light. A variety of different laser sources have been used, and these are presented to exemplify some of the radiation wavelengths that are suitable for use in the invention (lasers, however, are not needed to practice the invention; the invention provides a technique that is independent of source of light, provided the light induces a desired change in refractive index and is compatible with the radiation-altering pattern, such as the printed photomask, of the invention). For example, in the visible region, gratings can be written using the 457.9, 488.0, 496.5 and 501.7 nanometer lines of an argon ion laser. In the UV, gratings can be written using a frequency-doubled argon ion laser (244 nanometers), a krypton fluoride excimer laser (249 nanometers) a frequency quadrupled Nd: Yag Laser (266 nanometers) and a frequency-doubled xenon chloride pumped dye laser (230–255 nanometers). If a germanium-doped optical fiber is irradiated with low-fluence UV light prior to writing a grating, the spectral response of photosensitivity in the fiber is extended to wavelengths longer than 550 nonometers (Bilodeau, et al. *Tech. Dig. Opt. Fiber Comm. Conf.* OFC'92. PAP. WK1:140–41).

Where the material in which a change in index of refraction is to be induced is within a second material, that is, if the source of radiation selected to induce a change in refractive index in the material must pass through another material prior to passing through the material in which the index of refraction is to be changed, the second material should be relatively transparent to the radiation. For example, in an optical fiber, a fused silica-clad, germanium-doped fused silica core is ideal for induction of change in index of refraction with UV light since the fused silica cladding is relatively transparent to the radiation.

The invention provides a technique for forming, at a surface of an article, a radiation-altering pattern. As used herein, forming a radiation-altering pattern at a surface of an article is meant to define applying to (such as chemically depositing on), or forming in (such as engraving in or etching in) a pattern. In the example of an optical fiber, a patterned self-assembled monolayer, electroless or electrochemically-deposited metal pattern, pattern of polymeric material, or the like can be deposited on or formed at the outer surface of the fiber (cladding or jacket). Additionally, a layer of photoresist can be applied to the exterior surface, and a pattern protective of the photoresist applied to the exterior surface thereof. Then, the photoresist can be exposed to radiation and developed, resulting in a pattern of photoresist on the exterior surface that serves as a radiation-altering pattern. Alternatively, the exterior surface of the fiber (jacket or cladding) can be patterned with a self-assembled monolayer, metal pattern, polymer pattern, or the like that directs etching at the surface.

Referring now to FIG. 1, a portion of an optical fiber 10 having radiation-altering pattern, in particular an amplitude-modulating pattern 12 printed thereon is illustrated schematically. Optical fiber 10 is illustrative of articles in which differential indices of refraction can be written in accordance with the invention. Pattern 12 is defined by a plurality of interspersed bands each of which completely surrounds the optical fiber. The bands are each of a width equal to fiber portions 14, that is, each covers the optical fiber through a dimension 14 along the length of the fiber. The bands of the pattern 12 are separated from each other longitudinally by a dimension equal to fiber portions 16 (FIG. 1 is not necessarily drawn to scale).

When radiation is directed at the optical fiber, as discussed more fully below, the bands of pattern shadow, at least to some extent, the radiation from the fiber core. Thus, the portions of the fiber core within portions 16 are exposed to the radiation to an extent greater than portions of the fiber core within portions 14. A change in refractive index is thereby induced in the fiber core at portions 16 and, in portions 14 of the fiber, shadowed by pattern 12, the refractive index of the fiber core does not change (according to preferred embodiments) or changes to a very small extent relative to the change in refractive index of the fiber core at portions 16. Thus, pattern 12 is made of an amplitude-modulating material that, preferably, completely eliminates amplitude but, according to acceptable embodiments, reduces amplitude to the extent that portions 14 of the fiber undergo a change in refractive index less than the change in refractive index undergone by portions 16. Amplitude-modulating pattern 12 can be referred to as a photomask.

It can be seen that the longitudinal dimension of portions 14 of each section of the photomask and the spacing 16 between portions of the photomask (and ensuing dimension of and spacing between portions of the fiber core to which a change in refractive index is imparted) can be adjusted as desired by one or ordinary skill in the art for fabrication of a variety of gratings. It is also to be understood that the thickness of the fiber grating (defined as the fiber length over which the grating is written) can be adjusted. Bragg gratings, as an example, are generally understood to be gratings that are thick in comparison to the shortest period (or pitch) in the grating, the period being defined as the spacing of the illuminated regions, that is, the total of the dimension of one portion 14 and one portion 16 as illustrated in FIG. 1. The pitch, which is measured along the fiber axis, is related to its resonant wavelength ($\lambda_o$) by the Bragg condition:

$$\Lambda = \frac{\lambda_0}{2n_{\it eff}}$$

where $n_{\it eff}$ is the effective index of the retro-reflected mode. When such a grating is longer than a few wavelengths, it will strongly exhibit the Bragg effect.

The radiation-altering pattern of the invention, exemplified by the photomask illustrated in FIG. 1, offers several significant advantages over known techniques for producing optical fiber gratings. One advantage is that problems in mechanical stability between the fiber, the source of radiation, and/or a phase grating mask or aperture are eliminated since the pattern photomask that is created at the fiber adheres to the fiber during any vibration, eliminating any variation in radiation of the various portions of the optical fiber core. That is, if the optical fiber moves relative to the light source through normal apparatus vibration, the pattern will move with the fiber and the portions of the optical fiber core that are exposed to radiation and the portions that are not exposed to radiation remain essentially absolutely fixed. This is a significant advantage. Complications from apparatus vibration are among the most-discussed drawbacks of conventional optical writing of fiber optic gratings (see, for example, Morey, et al. *Optics & Photonics News*, February 1994; referenced above).

Another advantage is that, according to the preferred embodiment illustrated in FIG. 1, the photomask of the present invention masks the optical fiber through 360°. Therefore, the optical fiber can be exposed to radiation from all sides, for example by placing the masked fiber in an irradiation chamber defined by encircling fluorescent fixtures surrounded by a mirrored wall, or simply by irradiating the fiber from different directions, adding efficiency to the technique. In this arrangement, radiation converges on the optical fiber. In this context, "converging" is meant to define radiation that strikes an optical fiber from more than one direction radially. Converging radiation to optically write differential indices of refraction in an article can be used with any article in which it would be advantageous to irradiate from more than one direction, not limited to use with an optical fiber. These advantages are realized in all embodiments of the present invention in which a radiation-altering pattern is formed at a surface of an article.

The photomask of the invention need not be printed about the entire circumference of the optical fiber (or other article) as illustrated in FIG. 1, but need be printed on the fiber only to the extent that it will create a shadow at portions 14 of the fiber core when exposed to radiation selected to change the refractive index of the core. If the optical fiber is irradiated from one side only, for example, a photomask printed through an arc of perhaps only 20° may be required. Those of ordinary skill in the art can readily determine the extent to which the photomask need be printed on the fiber for illumination with a particular radiation arrangement.

Figure 2:
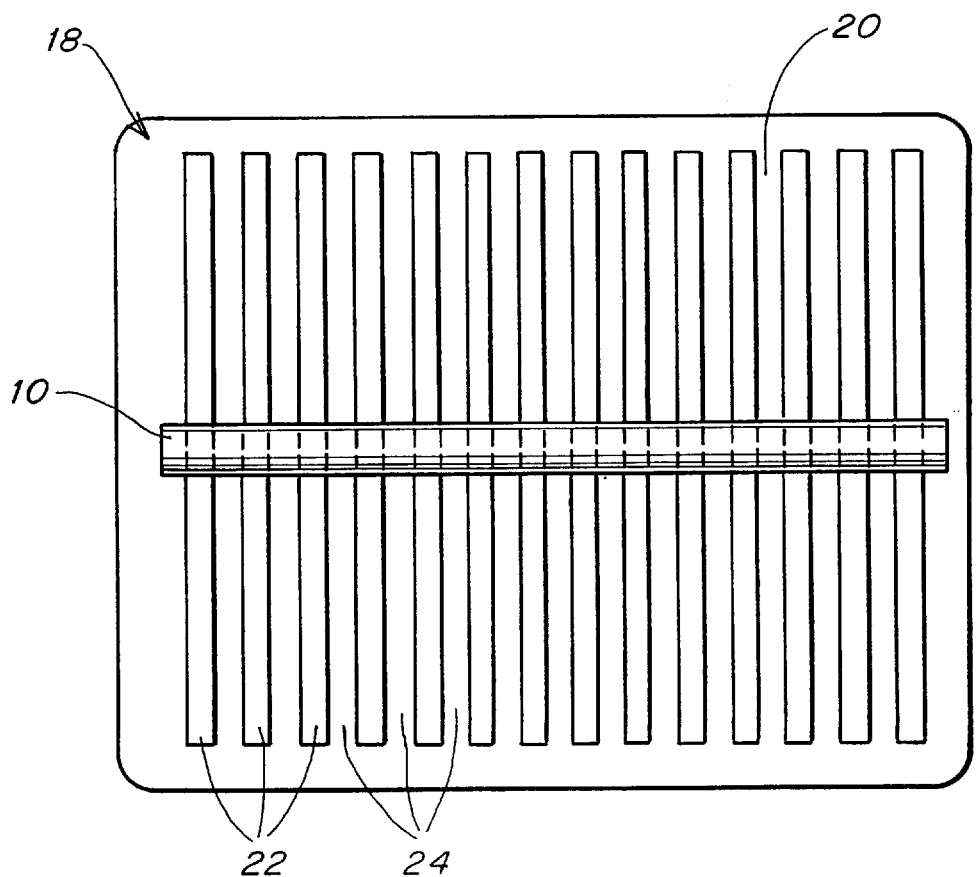
FIG. 2 illustrates schematically an optical fiber in contact with an applicator for applying a radiation-altering precursor material to the fiber.

Another advantage of the photomask of the invention is the simplicity, low cost, and reproducibility of the technique for printing the mask on the fiber. FIG. 2 illustrates schematically a top view of optical fiber 10 on an article 18 designed to print a radiation-altering pattern or precursor thereof, such as a photomask, on the fiber, according to a preferred embodiment. Article 18 has a contoured surface 20 including a plurality of protrusions 22 separated by intervening indentations 24. The outer surface of each protrusion preferably has an essentially rectangular cross-section, and the plurality of protrusions lie essentially in a single plane, thus when optical fiber 10 is placed on the contoured surface 20 oriented with its axis perpendicular to the linear protrusions, and is rolled across the contoured surface, the outer surface of each protrusion will contact a single cylindrical band of the outer surface of the optical fiber. When the outer surface of each protrusion is coated with, for example, a precursor of a radiation-altering pattern that will adhere at least nominally to the outer surface of the optical fiber, when the optical fiber is rolled across the contoured surface, a plurality of cylindrical bands defining the precursor are printed on the optical fiber. The outer surfaces of protrusions 22 can be of a variety of cross-sectional shapes, and need not be rectangular. For example, the shape can be selected by the practitioner to apply to regions 14 of fiber 10 a photomask 12 as desired.

Article 18 can be made of any material that can carry a precursor of a radiation-altering pattern and transfer the precursor to the optical fiber. Article 18 can be made of metal, ceramic, plastic, or the like. It is important only that a precursor will remain on the surfaces of protrusions 22 but will not adhere to the protrusion surfaces to an extent preventing transfer of the precursor to the outer surface of optical fiber 10. Article 18 can be formed in the same manner as a stamp for microcontact printing as described in U.S. Pat. No. 5,312,131 of Kumar, et al., incorporated herein by reference.

According to a preferred embodiment, the outer surfaces of protrusions 22 that contact optical fiber 10, or optionally the entire Article 18, is formed of a polymeric material. Polymeric materials suitable for use in fabrication of protrusions 22 (optionally entire article 18) may have linear or branched backbones, and may be crosslinked or noncrosslinked, depending upon the particular polymer and the degree of formability desired of the article. A variety of elastomeric polymeric materials are suitable for such fabrication, especially polymers of the general classes of silicone polymers, epoxy polymers, and acrylate polymers. Epoxy polymers are characterized by the presence of a three-member cyclic ether group commonly referred to as an epoxy group, 1, 2-epoxide, or oxirane. For example, diglycidyl ethers of bisphenol A may be used, in addition to compounds based on aromatic amine, triazine, and cycloaliphatic backbones.

Examples of silicone elastomers suitable for use as protrusions 22 (or entire article 18) include those formed from precursors including the chlorosilanes such as methylchlorosilanes, ethylchlorosilanes, and phenylchlorosilanes, and the like. A particularly preferred silicone elastomer is polydimethylsiloxane. Exemplary polydimethylsiloxane polymers include those sold under the trademark Sylgard by the Dow Chemical Company, Midland, Mich., and particularly Sylgard 182, Sylgard 184, and Sylgard 186. Materials suitable for use to form the outer surfaces of protrusions 22 (optionally article 18) are described in U.S. Pat. No. 5,512,131 (issued Apr. 30, 1996), incorporated herein by reference.

According to another embodiment, a precursor can be transferred from article 18 to the outer surface of optical fiber 10 by providing the precursor in indentation 24 rather than on the outside surface of protrusion 22 and rolling optical fiber 10 across the surface of article 18 and allowing the precursor to be transferred from indentations 24 to the optical fiber. Transfer of such material from indentations of a contoured surface is described in commonly-owned, co-pending application Ser. No. 08/616,929 of Kim, et al. entitled "Method of Forming Articles and Patterning Surfaces via Capillary Micromolding", filed Mar. 15, 1996 and incorporated herein by reference. In such an arrangement, a precursor such as a prepolymeric fluid, a catalyst that promotes metal deposition, a fluid carrying a dissolved or suspended species of a precursor, or the like can be applied, and the indentations are used to guide this fluid species and position the fluid species in a desired pattern proximate the surface. A self-assembled monolayer also can be used.

A wide variety of materials can be employed to form a radiation-altering pattern such as amplitude-modulating photomask 12 (with reference to FIG. 1) on the exterior surface of optical fiber 10, such materials being readily available to and selected by those of ordinary skill in the art without undue experimentation. According to embodiments involving an amplitude-modulating pattern, the material should block radiation selected to induce a change in refractive index of the optical fiber core to the extent that portions of the optical fiber core shadowed by the material are not altered in refractive index to a level that would hamper operation of the optically-written diffraction grating. For example, the material used to form a photomask 12, according to this embodiment, should block radiation directed toward the core of the optical fiber to the extent that a viable grating is created. When this is the case, a portion not blocked by the photomask undergoes a first change in refractive index and a portion blocked by the photomask undergoes no change in refractive index or undergoes a second, lesser change in refractive index, the first and second changes in refractive index differing to the extent that a useful diffraction grating results. According to a preferred embodiment, the radiation selected to induce the change in refractive index is completely blocked (reflected or absorbed) by the photomask.

Amplitude-modulating photomask 12 is made from a photomask precursor. As used herein, the term "photomask precursor" is meant to define material that, when applied to the exterior surface of an article will shield the article from radiation so that differential indices of refraction can be written in the article, or a material that can be made to undergo a chemical or physical change resulting in a photomask as described herein. A variety of materials such as conventional metal pastes for microelectronic fabrication, self-assembled monolayers such as those described in the above-referenced Kumar, et al. U.S. Pat. No. 5,512,131, polymeric and other materials such as those described in the above-referenced Kim, et al. application entitled "Method of Forming Articles and Patterning Surfaces via Capillary Micromolding", and other materials find use as exemplary photomask precursors in accordance with the invention. Those of ordinary skill can select an appropriate precursor material, without undue experimentation, simply by testing interaction of the precursor with the material that defines the exterior surface of the optical fiber (or other article in which differential indices of refraction are to be written) to assure that the photomask precursor adheres well enough to the article, or is a precursor of a material that adheres well enough to the article, so that the material can serve as a photomask. That is, the resultant photomask will not run off, or be ablated or photochemically decomposed during optical writing of the diffraction grating in an article. A second criteria is sufficient absorption or reflection of the irradiation selected to induce a change in refractive index in the fiber core, and this can be measured routinely using absorption spectroscopy.

One class of preferred precursors are chemical activating agents that promote metal deposition, such as those described in co-pending, commonly-known application of Hidber, et al. entitled "Microcontact Printing of Catalytic Colloids", filed Mar. 15, 1996 and incorporated herein by reference. The chemical activating agent (such as a palladium colloid) is applied to the optical fiber from Article 18, and the optical fiber is exposed to an environment in which the chemical activating agent promotes creation of material that serves as a photomask (for example, exposure to a metal plating bath whereupon metal is deposited, with reference to FIG. 1, at portions 14 of the optical fiber). According to a particularly preferred embodiment, a palladium colloid in a suitable carrier is applied to contoured surface 20 of article 18, most importantly to the outer surfaces of protrusions 22, optical fiber 10 is placed on surface 20 of article 18 in an orientation perpendicular to the linear protrusions, and rolled across the protrusions until the fiber has rotated through at least one revolution. The article 18 is made of PDMS. Following application of the palladium colloidal photomask precursor, the optical fiber is exposed to an electroless copper deposition bath and the palladium catalyzes copper deposition generating a periodic array of opaque copper bands bonded to the outside of the fiber (FIG. 1).

Figure 3:
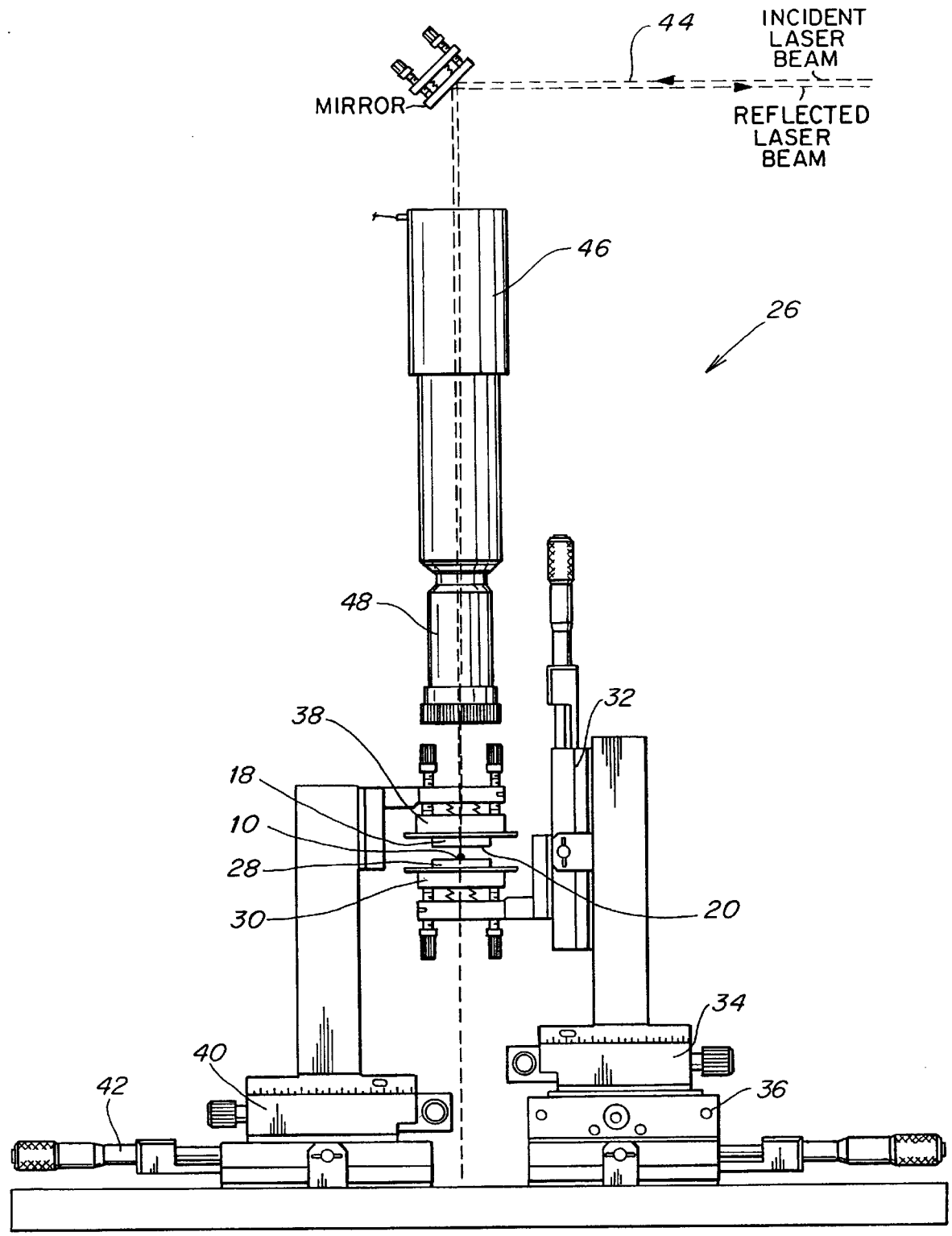
FIG. 3 illustrates schematically an arrangement for controlling application of a radiation-altering agent or precursor of a radiation-altering pattern to an optical fiber from an applicator.

Those of ordinary skill in the art will recognize that a variety of arrangements for aligning optical fiber 10 in an orientation precisely perpendicular to linear protrusions 22 of article 18 exist. Referring to FIG. 3, apparatus 26 for controlling the printing is illustrated and includes an PDMS support 28 upon which optical fiber 10 is placed, a mount 30, upon which support 28 is placed is controlled by a vertical translation stage 32, a rotation stage 34, and a horizontal translation stage 36. Above support 28 and optical fiber 10 is mounted article 18, with is contoured surface 20 facing the optical fiber. Article 18 is carried by a mount 38 that is positioned by a rotational stage 40 and a horizontal translation stage 42. A laser beam 44 that passes through the apparatus and is reflected ensures that the stages are properly aligned. A charge-coupled detector camera 46 connected to a microscope 48 and a video display allows observation of the printing to ensure accuracy.

Figure 4:
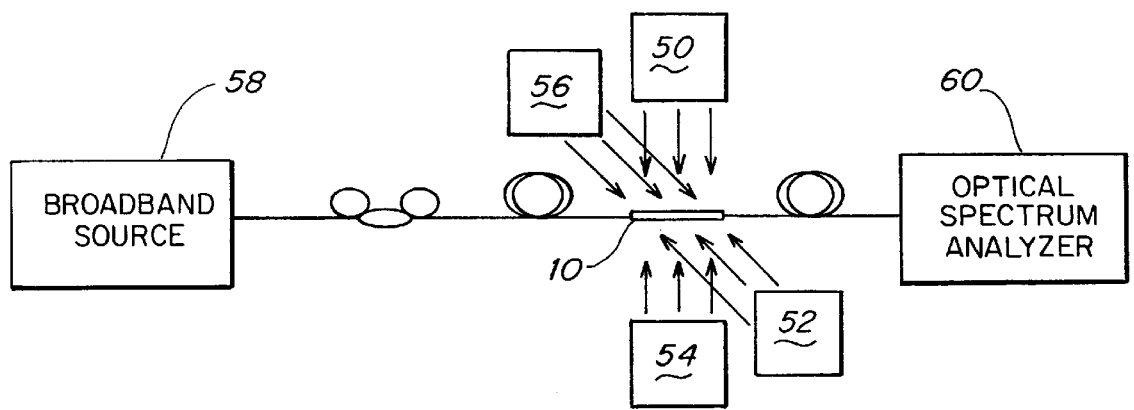
FIG. 4 illustrates schematically an arrangement for optically writing differential indices of refraction in an optical fiber on which a radiation-altering pattern of the invention has been created.

Referring now to FIG. 4, an arrangement for optically writing an in-fiber grating in optical fiber 10 is illustrated. As mentioned above, where photomask 12 is printed on the exterior surface of optical fiber 10 so as to extend about the entire circumference of the optical fiber, the optical fiber can be exposed to radiation about its entire circumference, and such an arrangement is illustrated in FIG. 4. Light sources 50, 52, 54, and 56 are positioned at relative orientations 0°, 90°, 180° and 270° about the optical fiber and the fiber is irradiated from these four evenly-spaced radial directions, for purposes of illustration. As discussed above, however, any orientation of radiation can be used. The optical fiber can include, for the purpose of monitoring the progress of creation of a diffraction grating in the fiber, at one end a broadband light source 58, and at another end an optical spectrum analyzer 60. The broadband source is passed through the fiber during irradiation from sources 50, 52, 54, and 56 to write the diffraction grating in the fiber and the optical spectrum analyzer determines a change in transmission spectrum of the fiber as a function of time of irradiation. As a grating is written in the fiber, a wavelength of light from the broadband source that resonates at the grating periodicity will exhibit a significant drop in transmission. The extent of radiation required can be determined in this manner. That is, an indication of when the grating has been written effectively is given.

Described is a technique for forming an amplitude-modulating agent (photomask 12) on an exterior surface of an optical fiber. Photomask 12 also can be formed in other techniques described below in connection with fabrication of small-scale structures on cylindrical substrates.

Additionally, the amplitude-modulating pattern need not be formed on optical fiber 10, but can be formed in the surface of optical fiber 10 by etching bands in optical fiber 10 corresponding to regions 14 followed by application within the etched, cylindrical grooves of an amplitude-modulating agent. In each case, amplitude-modulating pattern 12 is a radiation-altering pattern that alters radiation to which optical fiber 10 is exposed to selectively change refractive indices of portions 16 to an extent greater than portions 14. Pattern 12 modulates the radiation completely by completely blocking radiation from portions 14 of the fiber core, or by partially blocking such radiation from the core. In another embodiment, optical fiber 10 (or other article) includes material at its surface that is absorptive or reflective of radiation selected to induce a change in refractive index in the article. This material is selectively removed to form the amplitude-modulating pattern by, for example, using article 18 to print bands of a precursor on the fiber, the precursor dictating the pattern of removal of the outer material. For example, a self-assembled monolayer can be applied that is resistant to an etchant which removes the material, and following exposure of this arrangement to the etchant and optional removal of the self-assembled monolayer, the amplitude-modulating pattern is present at the surface in a pattern corresponding to the self-assembled monolayer pattern. Alternatively, the self-assembled monolayer can direct a resist precursor to regions uncoated by the self-assembled monolayer, and, following etching, a pattern complementary to the original pattern of the self-assembled monolayer will exist as an amplitude-modulating pattern.

According to another embodiment, the radiation-altering pattern is a phase-modulating pattern applied to the surface of an article such as optical fiber 10 or created in the surface of the article. The phase-modulating pattern, like the amplitude-modulating pattern such as photomask 12, adheres to optical fiber 10 to the extent that it translates with any vibrations, as described above. That is, it is integral with optical fiber 10 to that extent. A phase-modulating pattern can be created as described above in connection with the amplitude-modulating pattern, using similar techniques and similar materials, or according to any of the techniques described below, or as described in U.S. Pat. No. 5,512,131. The particular technique can be selected by those of ordinary skill in the art for convenience. A phase-modulating pattern will serve as a phase grating that, when optical fiber 10 is irradiated, will create alternating regions of constructive and destructive interference at the fiber core that will cause first portions of the fiber core to undergo a change in refractive index to an extent greater than second, contiguous, interspersed portions. As in the case of the amplitude-modulating pattern 12, the phase-modulating pattern allows for exposure of the optical fiber to radiation at any or all locations circumferentially. The phase-modulating pattern need not be applied or created in the fiber throughout the entire circumference, but only to the extent that the fiber will be exposed to radiation.

The phase-modulating pattern need not involve a separate agent, but can involve etching bands within the surface of an article such as optical fiber 10 without application of any auxiliary agent. Exposure of such a fiber to electromagnetic radiation will result in creation of a diffraction pattern of light directed at the fiber core, resulting in a pattern of differing indices of refraction in the core. Dimensions associated with a phase-modulating pattern can be selected by one of ordinary skill in the art with knowledge of the dimensions of the jacket, cladding, and core of optical fiber 10. In the phase-modulating embodiment, the phase-modulating pattern at the surface of fiber 10 generally will not correspond to the pattern of alternating indices of refraction created in the fiber core.

Gratings written in optical fibers serve a variety of uses, as is known to those of ordinary skill in art. Wavelength selection, tunability, mode selectivity and noise suppression are exemplary uses. Additionally, an optical fiber containing an in-fiber grating can define a sensor, for example a strain or temperature sensor. As strain is applied to the fiber, or the temperature of the fiber changes, the wavelength of light resonant with the grating will change. Gratings also can be used for in-fiber lasers to create cavity feedback. Additionally, a filter/reflector can be made by establishing a resonant cavity bounded by in-fiber gratings that passes only selected wavelengths. These and other uses are intended to form part of the invention and some are discussed in Morey, et al. *Optics in Photonics News,* February 1994 (referenced above).

Figure 5:
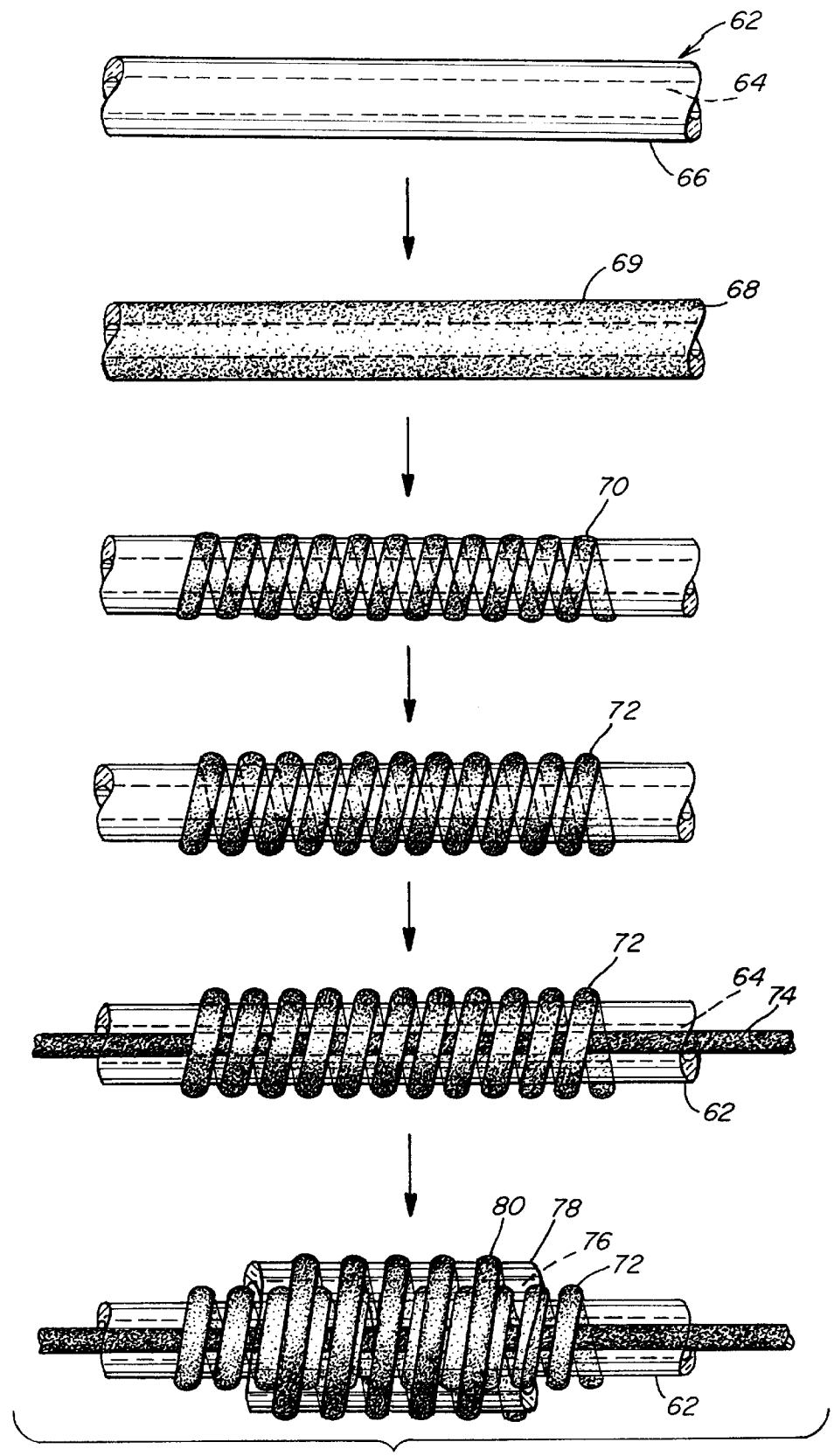
FIG. 5 illustrates schematically a technique for fabrication of a metallic coil on the exterior surface of a hollow, cylindrical article, formation of multi-layered coils, and creation of a microinductor or microtransducer.

The invention also provides techniques for fabricating small-scale metallic structures such as coils and stents, optionally on the exterior surface of cylindrical articles. Referring to FIG. 5, an embodiment of the technique is illustrated schematically. A cylindrical article 62 (including, as illustrated, a hollow, central passageway 64) has an exterior surface 66 that is coated with a thin layer 68 of metal having an exterior surface 69. A pattern of a molecular species is formed on exterior surface 69, the pattern being the same as, or complementary to, a pattern 70 of metal layer 68 desirably retained on external surface 66 of article 62. The molecular species can be a self-assembled monolayer in coil pattern 70, which is resistant to an etchant that can remove metal 68. Exposure of this arrangement to the etchant removes metal layer 68 except at coil pattern 70, coil pattern 70 being protected by the self-assembled monolayer. Alternatively, the molecular species can be a catalyst that promotes deposition of a metal from an electroless plating bath, and a plated metal protecting species, in the pattern of coil 70, applied to layer 68 in this manner. Subsequent etching can result in coil 70.

In another arrangement, a molecular species can be patterned in a pattern complementary to coil 70, which molecular species directs an etchant resist to form a pattern that covers coil pattern 70. In this case, the molecular species would be selected to be incompatible with a precursor of an etchant resist, where the precursor is more compatible with metal 68. Following formation of a resist in a pattern of coil 70 (and optional removal of the directing molecular species if the directing molecular species would be somewhat resistant to the etch), the system can be exposed to an etch removing portions of metal layer 68 other than portions in a coil pattern 70.

Described are techniques for establishing a thin layer of metal 68 in a coil pattern 70 on the exterior surface of a cylindrical article 62. Subsequently, metal is deposited on coil pattern 70 to define a final coil structure 72. The metal can be deposited via electroless deposition where metal pattern 70 is a catalyst, or by addressing metal coil 70 electrically and carrying out electrochemical deposition. The metal defined in coil pattern 70 and metal that is deposited thereon to define coil 72 can be the same, or different, depending upon the fabrication technique.

Metal coil 72 on substrate 62 can serve a variety of purposes. According to one, passageway 64 receives an NMR sample and coil 72 serves as an electromagnet for NMR analysis. According to another, coil 72 is removed from substrate 62 by, for example, dissolving the substrate, and the coil is used as an NMR coil or other device. According to another embodiment, as illustrated in FIG. 5, coil 72 remains on substrate 62 and ferromagnetic material 74 is passed through central cavity 64 of substrate 62. Ferromagnetic material 74 passing through coil 72 defines a concentrically wound, cylindrical microtransformer.

In one embodiment, a multi-layer coiled arrangement is produced. As used herein, the term "layer" of a coil means a coil that includes a metallic conductor in a coiled pattern where each portion of the conductor is in alignment, axially, with other portions of the coil. That is, a "layer" of a coil does not include conductor defining the coil on top of other conductor, or conductor sections staggered so that more "windings" can be provided per unit axial length of the coil. Each winding of the coil need not have the same radius of curvature, as substrate 62 could taper, and a coil formed about substrate 62 when it is tapered would still involve a single "layer" of coil. The invention provides a coil having a layer of turns of at least 30 turns per mm, preferably at least about 50 turns per mm, and more preferably at least about 100 turns per mm.

In FIG. 5, a second "layer" of coil is provided by inserting coil 72 and substrate 62 within a receptacle (central hollow portion) 76 of a cylindrical substrate 78 having deposited thereon a second coil 80. A concentric, cylindrical microtransformer results. Both inner coil 72 and outer coil 80 can be contacted electrically.

Figure 6:
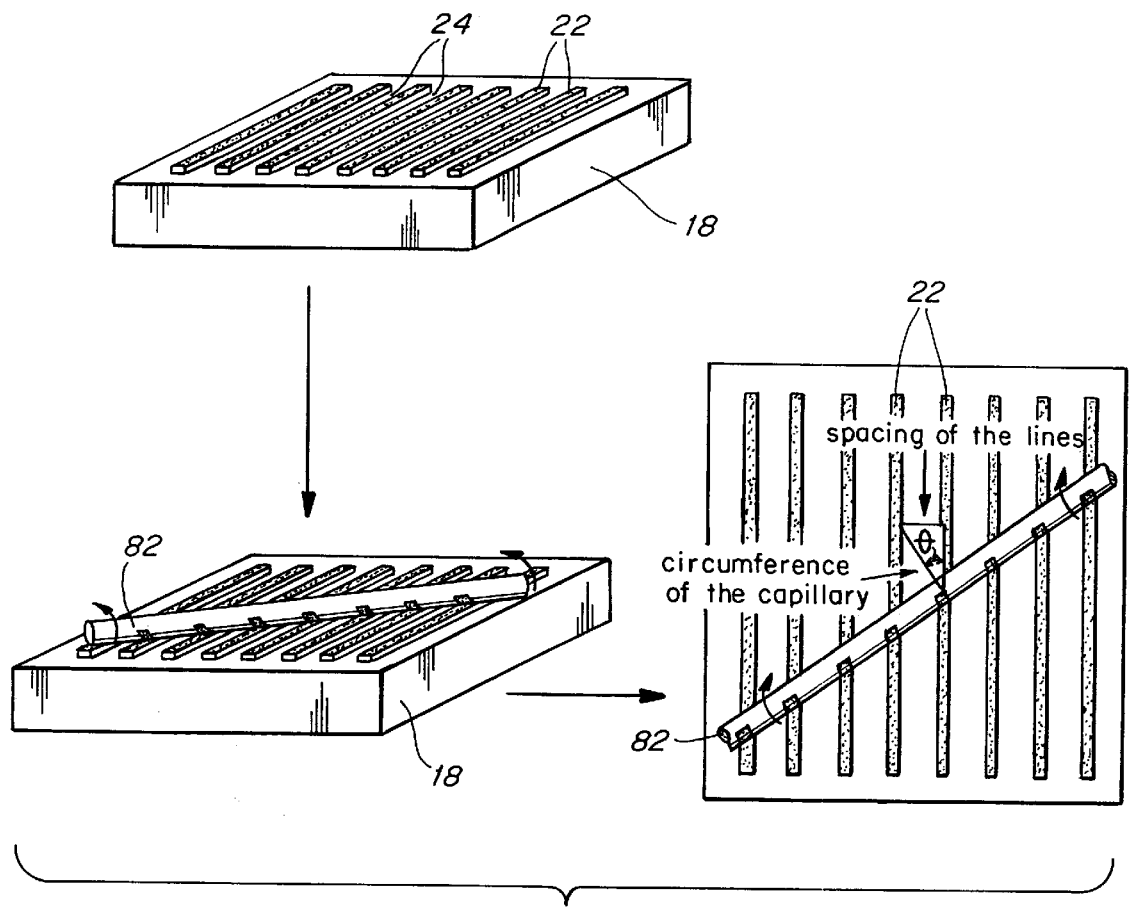
FIG. 6 illustrates schematically a technique for printing coils on an exterior surface of a cylindrical article.

Referring now to FIG. 6, a technique for patterning a coil on an exterior surface of a cylindrical article is illustrated schematically. An article 18 (as described above with reference to FIG. 2) is provided. For positioning, an arrangement as described above with reference to FIG. 3 can be used. A cylindrical article 82 is placed on the top surfaces of protrusions 22 at an angle that is not perpendicular to the protrusions, and rolled across the protrusions. Where the article 18 consists of an array of parallel protrusions, the relative orientation of the article and cylindrical article 82 can be adjusted so that when the cylindrical article 82 is rolled across the surface of the article 18 a continuous coil is printed on the exterior surface of cylindrical article 82. As in other embodiments, the material printed on the exterior surface of article 82 thereby can prevent removal of material from the surface or initiate deposition of the material at the surface. To select an appropriate orientation of cylindrical article 82 and parallel protrusions 22, the following equation can be used:

$$\sin\theta = \frac{nd}{2\pi r}$$

where $\theta$ is the angle made between linear protrusions 22 and a line perpendicular to the axis of article 82, d is the dimension of the spacing of the protrusions, r is the radius of cylindrical article 82, and n is an integer. Where n=1, a single helical structure results. Where n=2, a double helical structure results, etc.

Figure 7:
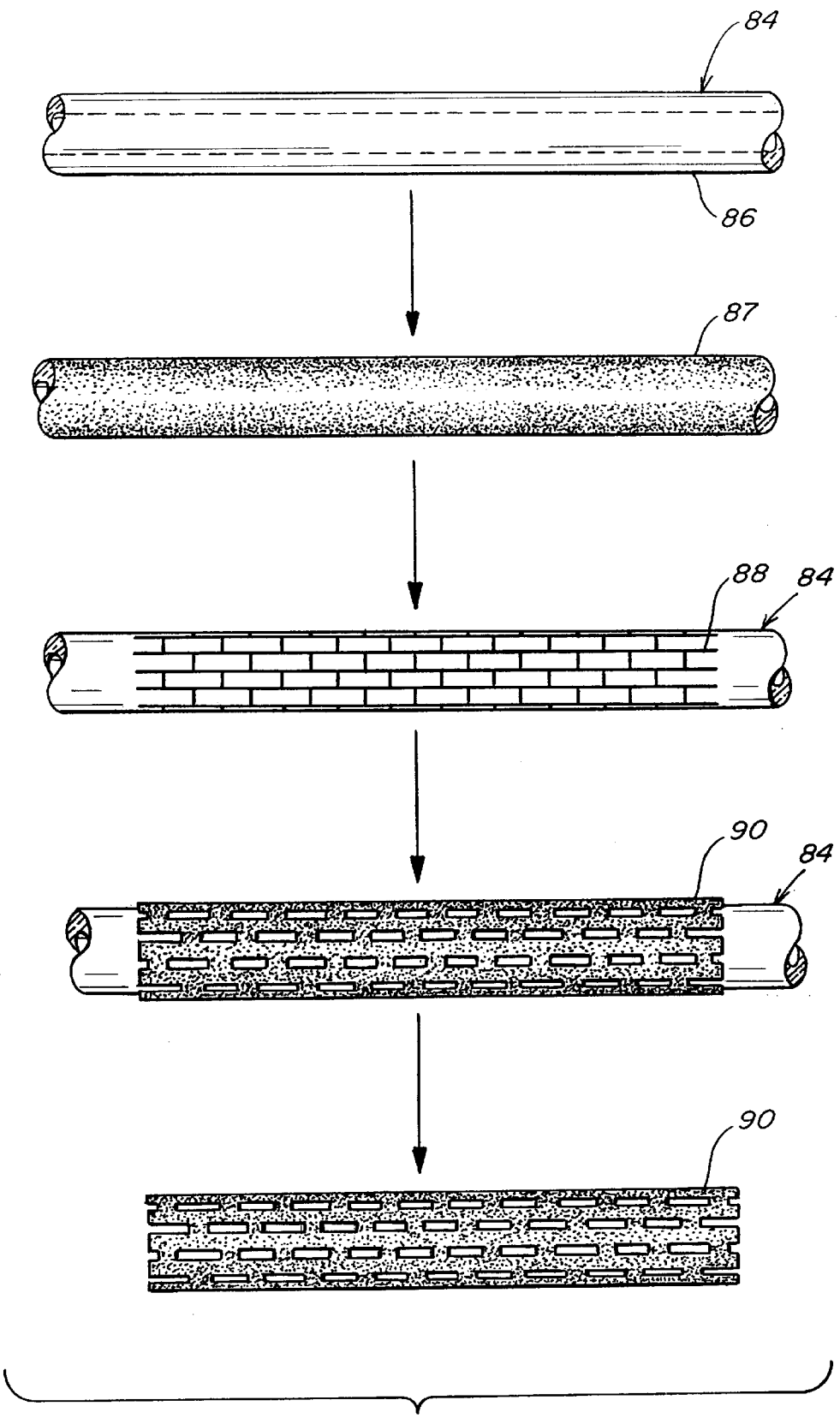
FIG. 7 illustrates schematically creation of a discontinuous, interconnected, cylindrical, metallic article such as a stent on the exterior surface of a cylindrical article.

Referring now to FIG. 7, a technique for fabricating a stent is illustrated. The technique involves providing a cylindrical article 84 having an exterior surface 86, depositing a thin layer of metal on surface 87, and removing a first portion of the layer of metal from the substrate while allowing a second, discontinuous, interconnected portion of the metal layer 88 to remain on the substrate. As used herein, the phrase "discontinuous, interconnected portion" is meant to define a portion of a layer of metal that includes voids, but is interconnected in that electrical contact with any portion of the portion provides electrical contact with the entire portion. A coil is a discontinuous, interconnected portion of a layer of metal.

Removal of portions of metal layer 87 (portions other than the second portion 88 that is allowed to remain) can be carried out by etching the first portions of the metal layer. This can be done by protecting second portion 88 by microcontact printing (U.S. Pat. No. 5,512,131) a pattern of a protecting species corresponding to portion 88 on layer 87. This can be accomplished by providing an article (not shown) similar to article 18 but including a protrusion pattern corresponding to the pattern of portion 88 of the metal layer, coating the protrusions with a precursor of an etchant resist, and forming the resist at portions 88 by rolling article 84 across the article, thereby transferring to portion 88 the precursor of the etchant resist. The precursor of the etchant resist can be a self-assembled monolayer-forming species, thus the etchant resist at portions 88 can be a self-assembled monolayer. Alternatively, a self-assembled monolayer can be formed at portion 88, followed by exposure of the arrangement to an etchant resist that is chemically compatible with the self-assembled monolayer at portion 88. For example, where the self-assembled monolayer at portion 88 terminates in a hydrophobic functionality, a hydrophobic etchant resist will readily be applied to the self-assembled monolayer and serve as an etchant resist. For example, where the self-assembled monolayer at portion 88 is one such as —$Cl_3SiR$ or —$(EtO)_3SiR$ (R=—$(CH_2)_3NH_2$, —$(CH_2)_3SH$, —$(CH_2)_3BR$, —$(CH_2)NCO$, —$(CH_2)_2(CF_2)_5CF_3$, or —$(CH_2)_{15}(CH=CH_2)$ (with subsequent treatment of the patterned self-assembled monolayers containing vinyl-terminated regions with an aqueous solution of $KMnO_4$ and $KiO_4$ to convert the olefins to carboxylic acids), and application of this self-assembled monolayer to the first portion of the surface 86 (the portion complementary to portion 88), followed by exposure to liquid polyurethane and curing, cured polyurethane as an etchant resist at regions 88 results. Removal of this self-assembled monolayer during, or prior to, exposure of the surface to etchant results in removal of the first portions of layer 87 complementary to remaining portion 88.

Subsequently, a layer of metal that defines the stent is deposited on the patterned, second portion 88. A discontinuous, interconnected, cylindrical, metallic article 90, having a thickness suitable for removal from substrate 84 to serve as a free-standing article, results. Deposition of metal at second portion pattern 88 can be carried out according to a variety of methods. According to one, portion 88 is a catalyst and the article is subjected to electroless deposition. According to another, electrical connection is made with pattern 88 and metal is electrochemically deposited at portion 88. Both techniques are well-known to those with ordinary skill in the art.

Subsequently, article 90 is removed from substrate 84 by, for example, dissolving substrate 84. A resulting free-standing article 90 results. Where article 90 serves as a stent, it can be disposed about an inflatable balloon of a catheter, positioned in a desired region of a vessel (typically a coronary artery) and expanded against the vessel wall by inflation of the balloon. The discontinuous pattern of article 90 can be expanded since portions of the pattern that run axially will, when the stent is expanded, be drawn into a zig-zag pattern (this can be visualized more easily with reference to structure 88).

Figure 8:
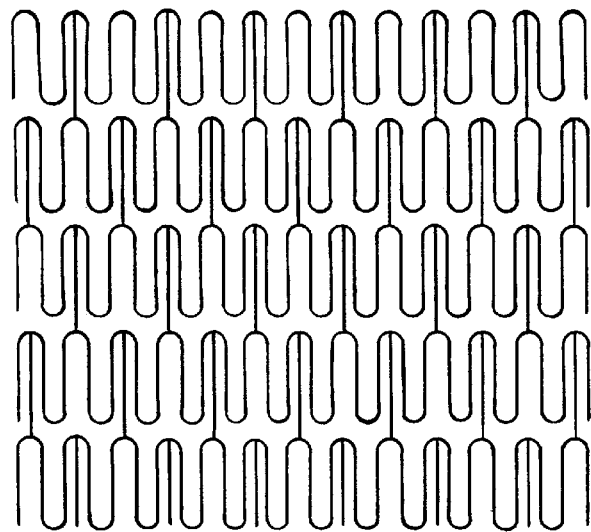
FIG. 8 illustrates schematically an alternate pattern for the article illustrated in FIG. 7.

Referring to FIG. 8, an alternate pattern for patterned metal portion 88 is illustrated. This pattern can be arranged about the cylindrical article with the axis of the article lying in any orientation relative to the pattern of FIG. 8, and the resulting stent is easily expandable.

In each of the above embodiments, techniques for creation of one arrangement can be used for creation of any other arrangement. The invention lies in the technique of printing, on a surface of an article, a precursor that dictates a pattern of deposition on the article, etching in the article, or a combination for creation of a variety of useful devices. The pattern can be formed on or in a cylindrical article and, according to one embodiment, involves a pattern having at least one continuous, isolated portion that encircles the cylinder. As used herein, "continuous, isolated portion that encircles the cylinder" is meant to define an arcuate portion that encircles the cylinder at least once, for example, as defining a cylindrical band or one period of a coil, and is isolated in that the portion circling the article does not contact other portions except where it contacts itself as in a band.

The function and advantage of these and other embodiments of the present invention will be more fully understood from the examples below. The following examples are intended to illustrate the benefits of the present invention, but do not exemplify the full scope of the invention.

EXAMPLE 1

Fabrication of Microcoil

Polyimide-coated capillaries were obtained from Polymicro Technologies, Inc. (Phoenix, Ariz.). The polyimide coating was burned off using a resistively-heated filament. The outer diameter of the stripped fiber was 134.5±0.5 microns, and the inner diameter was 95.6±1.5 microns. The stripped capillaries were coated with titanium (about 15–30 Angstroms) and silver (about 300–500 Angstroms) using an electron beam evaporator. Mechanical stages were used to rotate the capillaries about two orthogonal axes during deposition.

Lines of a self-assembled monolayer formed of hexadecanethiol were printed on the outside of the capillaries using an arrangement as illustrated in FIG. 6. The self-assembled monolayer was printed in a pattern complementary to that of metal pattern 70 as illustrated in FIG. 5. The hexadecanethiol-printed capillaries were inserted into a ferri/ferrocyanide bath to remove silver not protected by the hexadecanethiol according to pattern 70 as illustrated in FIG. 5. Etching times on the order of 20 seconds were sufficient. This resulted in silver spirals 70 of a few hundred Angstroms thickness on glass capillaries coated with titanium a few tens of Angstroms thick. The samples were exposed 1% hydrofluoric acid for ten seconds to remove the exposed titanium.

A thin, gold wire was attached to one end of the silver-titanium spiral 70 using silver paint. Gold then was electroplated onto metallic pattern 70 by adjusting the current density to about 4 mA/cm$^2$ and plating for several minutes. The plating technique resulted in spirals 72 made of gold, approximately 1–3 microns thick, on top of silver on top of titanium adhered to the outside of glass capillary 62.

The spiral 72 can be used as an electromagnet in, for example, an NMR arrangement in which an NMR sample is passed through the central portion 64 of the capillary 62. Coils 72 having a lateral dimension (dimension of a portion of the coil, in a direction axially, of 150, 50 and 20 microns) coils of length were produced.

EXAMPLE 2

NMR Microcoil

A micro-NMR sample tube was fabricated. A silver-titanium spiral 70 of 1 turn per 100 microns length, 17 turns in length was formed on the outside of a stripped capillary as described in Example 1. Subsequently, copper was plated on the silver-titanium coil.

Figure 9:
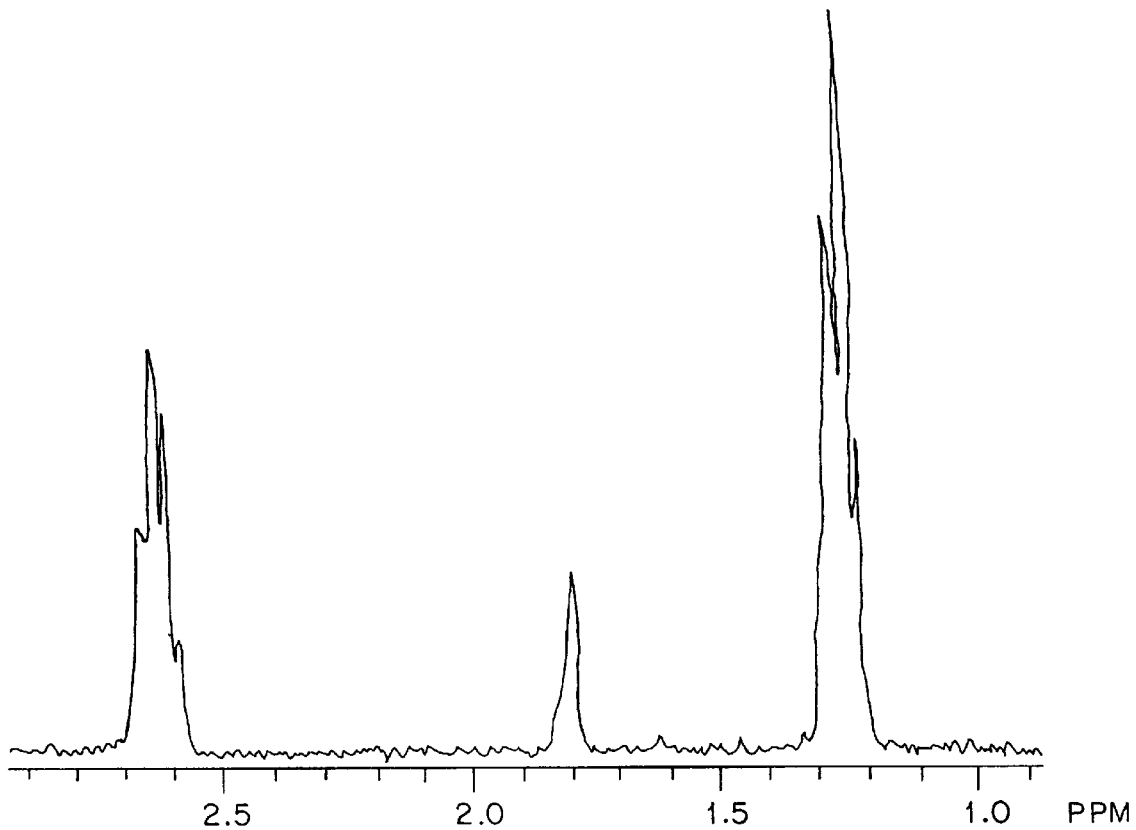
FIG. 9 is an NMR spectrum of ethylbenzene obtained in a micro-NMR sample tube fabricated in accordance with the invention.

Neat ethylbenzene (including a small amount of water contaminant) was introduced into the capillary. NMR analysis was carried out as described in Olson, et al., *Science,* 270, 1967–1970 (Dec. 22, 1995). The sample, coil, and tube were immersed in fluorinert™ FC-43 and placed in a General Electric GN-300WB 300 MHz sperometer, and an NMR spectrum obtained.W™ The spectrum appears in FIG. 9.

EXAMPLE 3

Evaluation of Electromagnet

The arrangement described in connection with Example 1 was provided. Ferromagnetic wire (80% Ni, 15% Fe, 4.4% Mo, 6.6% other; diameter of 80±2 microns) was inserted into the core of the capillary (opening 64). The wire is sold under the mark MONIFE 479 from California Fine Wire (Grover Beach, Calif.). The outer coil was contacted electrically. The connections were made with a test fixture of an LCR meter (Hewlett-Packard model 4284 A with internal DC bias, option 001) and Test Fixture 16334 A SMD. With this meter, inductance and resistance were determined as a function of frequency, magnitude of current used for the test, and magnitude of a constant bias applied during the test period.

A second arrangement involved a second coil spaced from the first coil. Electrical connection was made to each coil. Using two coils around adjacent regions of the same capillary, qualitative measurement of magnetic field induced by an alternating current passing through one of the coils was made by measuring the induced voltage in the other coil. For a given number of turns per inch, the inductance was a linear function of the length of the coil, and inductance per unit length was a quadratic function of the number of turns per unit length. The resulting electromagnet can be treated as an ideal solenoid, and the saturation point of the core material is the only limiting factor in the achievable magnetic field.

EXAMPLE 4

Creation of Microtransformer

A structure including an inner coil, an outer coil, and a central wire was fabricated as described above in connection with Examples 1 and 3 and as illustrated in FIG. 5.

The specific dimensions were inner coil: length=14.5 mm, winding=$2 \times 10^4$ turns/m and, for the outer coil: length=3.1 mm and $1 \times 10^4$ turns/m. Inductance and resistance of the inner and outer coils, at 10 mA applied current in the frequency range of from 1 kHz to 1 MHz, was measured. The inductance and resistance of the inner and outer coils connected in series with polarities aligned and opposed, at 10 mA applied current, in the frequency range of 1 kHz to 1 MHz, was measured. The coupling efficiency in the frequency range from 1 kHz to 1 MHz was calculated.

The microtransformer had efficient coupling (coupling efficiency greater than 0.9) of its primary and secondary coils at frequencies less than 20 kHz.

Those skilled in the art will readily appreciate that all parameters listed herein are meant to be exemplary and that actual parameters will depend upon the specific application for which the methods and apparatus of the present invention are being used. It is, therefore, to be understood that the foregoing embodiments are presented by way of example only and that, within the scope of the appended claims and equivalence thereto, the invention may be practiced otherwise and as specifically described.

What is claimed is:

1. A method comprising:
    forming a pattern of a self-assembled monolayer on an exterior surface of a cylindrical article, the pattern including at least one continuous, isolated portion that encircles the cylinder; and
    contacting the article with an etchant that reacts chemically with the article thereby removing a portion of the article in a pattern dictated by the pattern of the self-assembled monolayer.

2. A method as in claim 1, wherein the self-assembled monolayer is a resist to the etchant, and the etchant reacts chemically with the article at portions other than portions at which the self-assembled monolayer is formed.

3. A method as in claim 1, wherein the cylindrical article contains a central passageway.

4. A method as in claim 3, wherein the central passageway is constructed and arranged to receive an NMR sample and the article is constructed and arranged for positioning in NMR analysis equipment.

5. A method as in claim 3, wherein the central passageway contains a ferromagnetic material.

6. A method as in claim 1, wherein the exterior surface is a surface of metal.

7. A method as in claim 6, wherein the article comprises a cylindrical substrate having an exterior surface carrying a layer of metal, the method involving contacting the article with an etchant that reacts chemically with the metal thereby degrading a portion of the metal in a pattern.

8. A method as in claim 7, further comprising removing the self-assembled monolayer and plating a second metal on the metal remaining on the substrate.

9. A method as in claim 1, the forming step involving transferring the self-assembled monolayer to the exterior surface of the cylindrical article in the pattern from an application surface of an applicator.

10. A method as in claim 1, comprising forming the self-assembled monolayer on the exterior surface of the cylindrical article in the pattern, while leaving at least one portion of the exterior surface of the article, other than the pattern, free of the self-assembled monolayer.

11. A method as in claim 1, the contacting step involving removing a portion of the article in the pattern, while leaving a remaining portion of the article on the exterior surface of the cylindrical article defining a coil.

12. A method as in claim 1, the contacting step involving removing a portion of the article in the pattern, while leaving a remaining portion of the article on the exterior surface of the cylindrical article defining a stent.

13. A method comprising:
    forming, on an exterior surface of a cylindrical substrate, a discontinuous, interconnected, cylindrical, metallic article by providing a layer of metal on the exterior surface of the substrate and removing a first portion of the layer of metal from the exterior surface of the substrate while allowing a second, discontinuous, interconnected portion of the metal layer to remain on the substrate and to define the discontinuous, interconnected, metallic article, the step of removing the first portion comprising transferring to the second portion of the layer of metal, from an application surface of an applicator, a precursor of an etchant resist, forming the resist at the second portion, and exposing the substrate to an etchant that removes the metal at the first portion; and
    removing the metallic article from the substrate.

14. A method as in claim 13, the step of removing the first portion comprising chemically etching the first portion of the layer of metal.

15. A method as in claim 13, wherein the precursor comprises a self-assembled monolayer-forming species, the step of forming the resist involving forming a self-assembled monolayer that is resistant to the etchant at the first portion of the metal layer.

16. A method as in claim 13, wherein the precursor comprises a self-assembled monolayer-forming species, the step of forming the resist involving forming a self-assembled monolayer at the first portion of the metal layer and depositing an etchant resist on the self-assembled monolayer.

17. A method as in claim 13, wherein the precursor comprises an activating agent capable of promoting deposition of a metal, and the step of forming the resist involves depositing the metal, via a reaction involving the activating agent, at the second portion of the layer of metal.

18. A method as in claim 13, wherein the metallic article is a coil.

19. A method as in claim 13, wherein the metallic article is a stent.

20. A method comprising forming, on an exterior surface of a cylindrical substrate, a discontinuous, interconnected, cylindrical, metallic article by providing a layer of metal on the exterior surface of the substrate, removing a first portion of the layer of metal from the exterior surface of the substrate while allowing a second, discontinuous, interconnected portion of the metal layer to remain on the substrate, and depositing a metal that defines the discontinuous, interconnected metallic article on the second portion of the metal layer; and removing the metallic article from the substrate.

21. A method as in claim 20, wherein the second portion of the metal layer is a catalyst, the depositing step comprising effecting electroless metal deposition at the second portion of the metal layer thereby depositing a metal that defines the discontinuous, interconnected metallic article on the second portion of the metal layer.

22. A method as in claim 20, the depositing step comprising electrochemically depositing a metal that defines the discontinuous, interconnected metallic article on the second portion of the metal layer.

23. A method as in claim 22, wherein the metal layer and the electrochemically deposited metal are the same.

24. A method as in claim 22, the step of removing the first portion comprising chemically etching the first portion of the layer of metal.

25. A method as in claim 24, the step of removing the first portion comprising transferring to the second portion of the layer of metal, from an application surface of an applicator, a precursor of an etchant resist, forming the resist at the second portion, and exposing the substrate to an etchant that removes the metal at the first portion.

26. A method as in claim 25, wherein the precursor comprises a self-assembled monolayer-forming species, the step of forming the resist involving forming a self-assembled monolayer that is resistant to the etchant at the first portion of the metal layer.

27. A method as in claim 25, wherein the precursor comprises a self-assembled monolayer-forming species, the step of forming the resist involving forming a self-assembled monolayer at the first portion of the metal layer and depositing an etchant resist on the self-assembled monolayer.

28. A method as in claim 24, the step of removing the first portion comprising transferring to the first portion of the layer of metal, from an application surface of an applicator, a self-assembled monolayer-forming species to form a self-assembled monolayer at the first portion, forming the resist at the second portion, and exposing the substrate to an etchant that removes the metal at the first portion.

* * * * *